(12) United States Patent
Wang et al.

(10) Patent No.: US 9,772,553 B2
(45) Date of Patent: Sep. 26, 2017

(54) MODIFIED EPOXY ACRYLATE, PHOTORESIST COMPOSITION AND METHOD FOR PRODUCING THE SAME, TRANSPARENT PHOTORESIST

(71) Applicant: BOE TECHNOLOGY GROUP CO., LTD., Beijing (CN)

(72) Inventors: Xuelan Wang, Beijing (CN); Haifeng Zhou, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/606,371

(22) Filed: Jan. 27, 2015

(65) Prior Publication Data

US 2015/0378254 A1   Dec. 31, 2015

(30) Foreign Application Priority Data

Jun. 27, 2014   (CN) .......................... 2014 1 0302873

(51) Int. Cl.
| | | |
|---|---|---|
| G03F 7/038 | (2006.01) | |
| C08G 59/24 | (2006.01) | |
| C08G 59/17 | (2006.01) | |
| C08G 59/14 | (2006.01) | |
| C08L 63/10 | (2006.01) | |
| C08L 75/14 | (2006.01) | |
| C08G 18/67 | (2006.01) | |

(52) U.S. Cl.
CPC ............ *G03F 7/038* (2013.01); *C08G 18/67* (2013.01); *C08G 59/1466* (2013.01); *C08G 59/1488* (2013.01); *C08L 63/10* (2013.01); *C08L 75/14* (2013.01)

(58) Field of Classification Search
CPC .......... G03F 7/038; G03F 7/028; C08L 63/10; C08L 75/14; C08G 18/67; C08G 59/1466; C08G 59/1488
See application file for complete search history.

(56) References Cited

U.S. PATENT DOCUMENTS

| | | | |
|---|---|---|---|
| 5,466,755 A | 11/1995 | Sakagami et al. | |
| 5,468,886 A | 11/1995 | Steinmann et al. | |
| 2004/0115437 A1* | 6/2004 | Dammann | C08F 22/105 |
| | | | 428/413 |

FOREIGN PATENT DOCUMENTS

| | | |
|---|---|---|
| CN | 1077470 A | 10/1993 |
| CN | 101070329 A | 11/2007 |
| CN | 102358717 A | 2/2012 |

OTHER PUBLICATIONS

English translation of Description and claims of CN 102358717 A from European patent Office website using Google translate generated Mar. 7, 2016, 26 pages.*

Lee et al "characterization of clearcoats containing phophporic acid-functionalized acrylic polyols for atuomotive precoated metal sheet coatings", J. Coat. Technol. Res. vol. 11 No. 5, pp. 697-710, year 2014.*

The First Office Action dated Nov. 4, 2015 corresponding to Chinese application No. 201410302873.8.

Hongxing LI"Preparation of new hydroxy acrylic aqueous dispersion and high PVC coating"; Hunan University; Jun. 15, 2013; Chinese Mater's Theses Full-Text Database, Engineering, Science and Technology I., pp. 33-50 and english abstract added.

* cited by examiner

*Primary Examiner* — Cynthia Hamilton
(74) *Attorney, Agent, or Firm* — Nath, Goldberg & Meyer; Joshua B. Goldberg; Scott H. Blackman

(57) ABSTRACT

The present invention relates to a modified epoxy acrylate and a method for producing the same, a photoresist composition and a method for producing the same, and a transparent photoresist formed from the photoresist composition. The modified epoxy acrylate is an epoxy acrylate modified with phosphate monomer which has a structure represented by Formula I

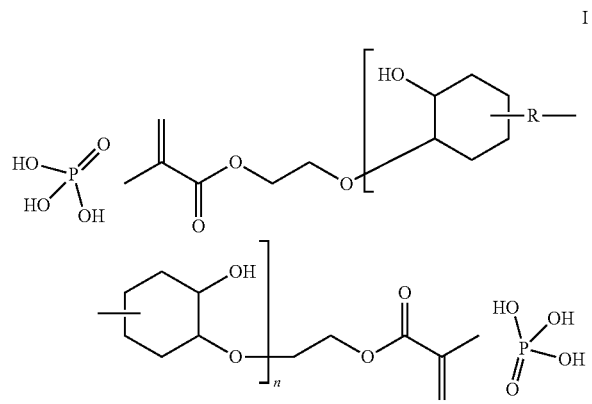

wherein, n is an integer selected from 1~21, R is a short-chain carboxylic acid ester group having the structural formula

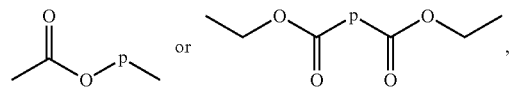

in which p is a bivalent saturated or unsaturated carbon chain having 1~10 carbon atoms, and the carbon chain is optionally substituted by alkyl, alkenyl, hydroxy, nitro or halogen. Since the phosphate can react with the multi-valence metal in substrates so as to connect the polymer onto the substrates firmly through covalent bonds, therefore the adhesion force is improved significantly and the protective function of the tranparent photoresist is improved accordingly.

12 Claims, No Drawings

MODIFIED EPOXY ACRYLATE, PHOTORESIST COMPOSITION AND METHOD FOR PRODUCING THE SAME, TRANSPARENT PHOTORESIST

FIELD OF THE INVENTION

The present invention relates to the technical field of photoresist, particularly to a modified epoxy acrylate and a method for producing the same, a photoresist composition and a method for producing the same; and a transparent photoresist formed from the photoresist composition.

BACKGROUND OF THE INVENTION

Photoresists, also referred to as photoresist agents, are light-sensitive material used in many industrial processes. A photoresist is mainly formed by mixing a resin, a photosensitizer and an organic solvent. The resin in the exposed region can undergo a fast photo-curing reaction upon light irradiation, which, upon treatment by suitable photoresist developing liquid and with the soluble portion being dissolved, gives the cured film (hence, transparent photoresist) image. Photoresists could be classified into transparent photoresists and other photoresists with colors. In the processes of printed-circuit board, when the flexible wiring board is used for the transparent electrodes of the mounting surface, the transparency thereof is required, and a photoresist composition for transparent photoresist can be cured to form the solder resist of the flexible wiring board. It requires the yellowing resistance and high transparency of the transparent electrode protective film in the touch screen monitor, and the photoresist composition for transparent photoresist could be used as the electrode protective film of such a transparent electrode plate of the monitor. The current photoresist composition for a transparent photoresist comprises a transparent resin, an unsaturated monomer, a photoinitiator, a diluent agent and a solvent.

However, the transparent photoresist formed from the current photoresist composition for transparent photoresist However, the transparent photoresist formed from the current photoresist composition for transparent photoresist is poor in adhesion property, which will decrease the protective function thereof for the transparent electrode or the flexible wiring board, and further decreasing the quality of the transparent electrode or the flexible circuit board.

SUMMARY OF THE INVENTION

An object of the present invention is to provide a modified epoxy acrylate and a method for producing the same, a photoresist composition and a method for producing the same, and a transparent photoresist formed from the photoresist composition, in order to improve the adhesive force of the transparent photoresist, and to further improve the protective function of the transparent photoresist.

Firstly, the present invention provides a modified epoxy acrylate, which is an epoxy acrylate modified with phosphate monomers, with the structural formula represented by Formula I:

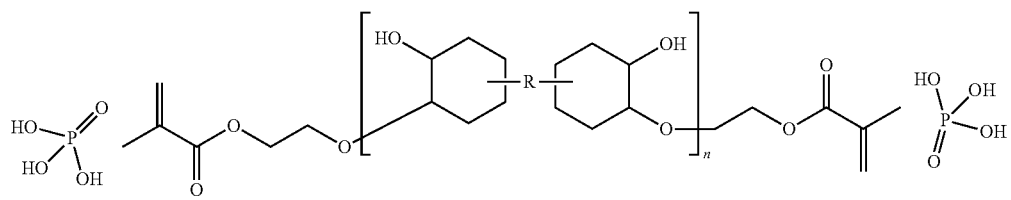

wherein, n is an integer selected from 1-21, R is a short-chain carboxylic acid ester group having the structural formula

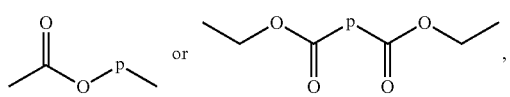

in which p is a bivalent saturated or unsaturated carbon chain having 1-10 carbon atoms, and the carbon chain is optionally substituted by alkyl, alkenyl, hydroxy, nitro or halogen. For example, p may be methylene, ethylene, propylidene, isopropylidene, butylidene and the likes.

Preferably, the epoxy acrylate modified with phosphate monomers have the structural formulas represented by Formula II or Formula III:

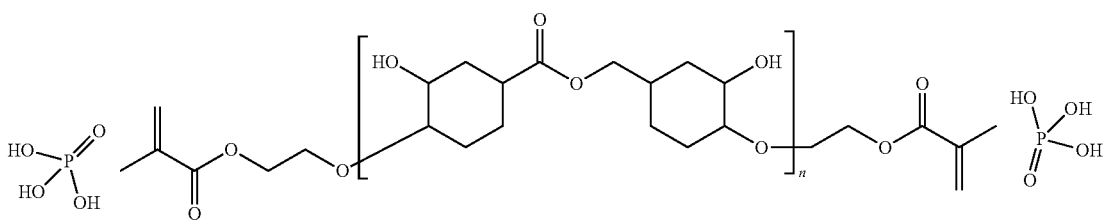

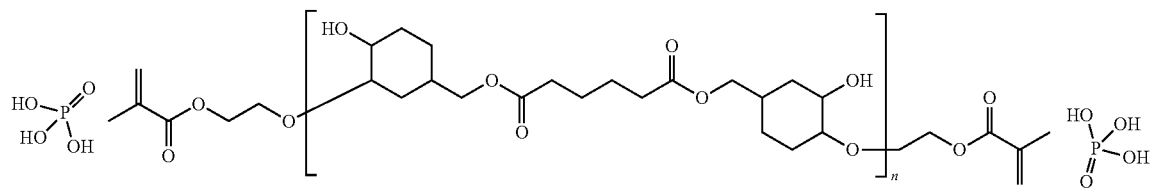

wherein, n is an integer selected from 1~21.

Further, the present invention further provides a photoresist composition, comprising:

30~50 parts by weight of one or more of the above-described epoxy acrylate modified with phosphate monomers;

10~20 parts by weight of aliphatic polyurethane acrylate resins;

20~30 parts by weight of active monomers;

5~10 parts by weight of active diluent agents;

2~5 parts by weight of photoinitiators;

30~35 parts by weight of organic solvents.

Preferably, the epoxy acrylate modified with phosphate monomers is in the range of 40~48 parts by weight; the aliphatic polyurethane acrylate resin is in the range of 12~15 parts by weight; the active monomer is in the range of 20~25 parts by weight; the active diluent agent is in the range of 5~8 parts by weight; the photoinitiator is in the range of 3~4 parts by weight; the organic solvent is in the range of 32~34 parts by weight.

Preferably, the active monomer includes low functionality monomers, alkyl chain-acrylates, and high functionality monomers in a range of 1:0.5~1:1.5~6 by mass ratio. Low functionality monomers (including 1~3 functional groups) can form a highly smooth film which is resist to solvents and contamination; alkyl chain-acrylates can form a film which has good resistance to photo decomposion, high temperature, and acidic or alkaline corrosion; high functionality monomer (including more than 3 functional groups) has a high ultraviolet activity, high crosslinking density, and the cured film formed therefrom is very rigid, but brittle at the same time. Therefore, when the three of the above is used in combination, especially with a ratio of 1:0.5~1:1.5~6, the resultant cured film can have a high hardness and toughness, while having the characteristics of anti-pollution, high temperature resistance and anti-corrosion and the like.

Preferably, the low functionality monomer includes cyclohexane-1,4-dimethanol divinylether or triglycol divinyl ether; the alkyl chain-acrylates include glycol dimethacrylate or triethylene glycol di-2-methyl acrylate; the high functionality monomer includes ethoxylated pentaerythritol tetracrylate, dipentaerythritol pentaacrylate, or dipentaerythritol hexaacrylate.

Preferably, the active diluent agent includes one or more of allyl glycidyl ether, glycidyl phenyl ether, glycol diglycidyl ether and ricinus oil triglycidyl ether; the photoinitiator includes cyanine dye cation complexes, triphenyl-alkyl boron anion complexes and aromatic iodonium salts; the organic solvent includes aliphatic organic solvents.

Preferably, the photoresist composition further includes 3~5 parts by weight of fillers and 1~2 parts by weight of additives.

Preferably, the filler includes polyamide wax suspensions; the additive includes anti-foaming agents, dispersing agents or leveling agents.

Yet still, the present invention provides a transparent photoresist, obtained from the photoresist composition of the present invention.

The present invention further provides a method for producing the modified epoxy acrylate, comprising:

Performing a polymerization of 2-hydroxyethyl methacrylate phosphate and epoxy compound represented by formula IV in the present of a basic catalyst, to obtain the epoxy acrylate modified with phosphate monomers represented by formula I, wherein, the molar ratio of the 2-hydroxyethyl methacrylate phosphate to the epoxy compound is 1:0.5~10; the reaction formula being as follows:

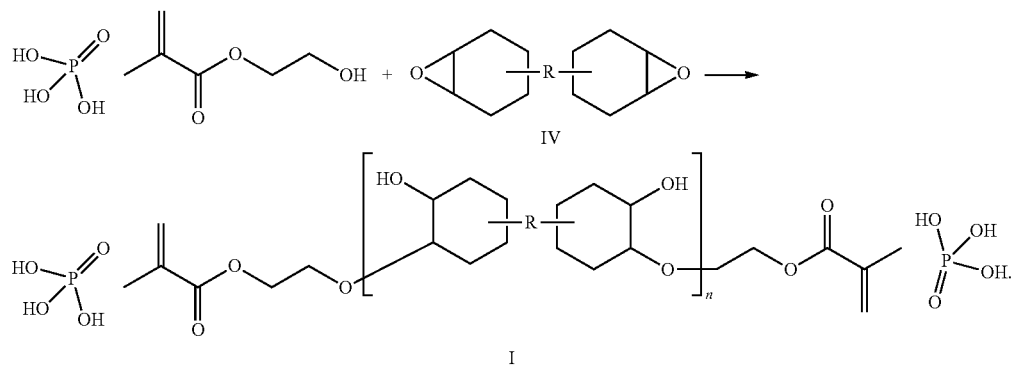

Besides, the present invention provides a method for producing a photoresist composition, comprising:

Taking and mixing the epoxy acrylate modified with phosphate monomers, aliphatic polyurethane acrylate resins, active monomers, active diluent agents and photoinitiators according to the respective parts by weight, to obtain a mixture;

Performing a sand grinding treatment of the above mixture, to form a mixture with a micron level fineness; and Adjusting the viscosity of the mixture with micron level fineness with organic solvents.

DETAILED DESCRIPTION OF CERTAIN EMBODIMENTS

Hereinafter, the present invention will be described in detail, in order to make the objects, technical solutions and advantages of the present invention more clear.

An embodiment according to of the present invention provides a modified epoxy acrylate, which is an epoxy acrylate modified with phosphate monomer, with the structural formula represented by Formula I:

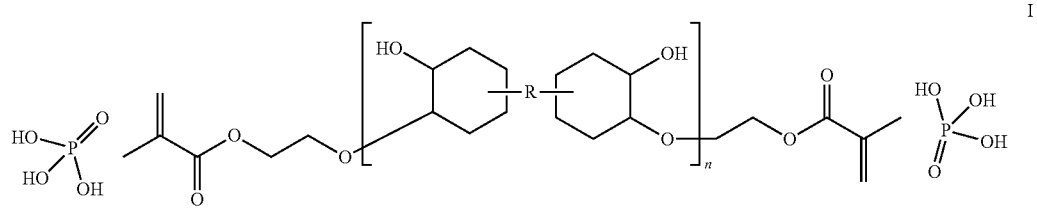

wherein, n is an integer selected from 1~21, R is short-chain carboxylic acid ester group having the structural formula

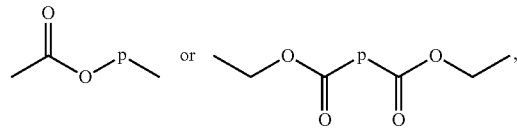

in which p is a bivalent saturated or unsaturated carbon chain having 1~10 carbon atoms, and the carbon chain is optionally substituted by alkyl, alkenyl, hydroxy, nitro or halogen. For example, p may be methylene, ethylene, propylidene, isopropylidene, butylidene and the likes.

The epoxy acrylate modified with phosphate monomers represented by Formula I is obtained by modification of the epoxy acrylates by phosphates, and has high curing speed and high adhesiveness to the base material. The addition of the epoxy acrylate modified with phosphate monomers into the photoresist composition can improve high temperature resistance, adhesion force and saline water resistances of the cured film formed from the photoresist composition, and further improve the protective functions of the transparent photoresist. Besides, the manufacturing costs of the epoxy acrylate modified with phosphate monomers are low. R is a short-chain carboxylic acid ester group. It should be noted that, the term "short-chain" refers to a carbon chain having 1~10 carbon atoms. "n" is any integer selected from 1~21, and for example, n could be 1, 2,5,10,20 or 21, n could also be 1~3, 2~6 etc.,. If n is too large, the molecular chain would be too long, and accordingly the adhesion force is low. "n" is any integer selected from 1~21, and preferably 3-18, more preferably 5-15.

Preferably, the epoxy acrylate modified with phosphate monomers has the structural formulas represented by Formula II or Formula III:

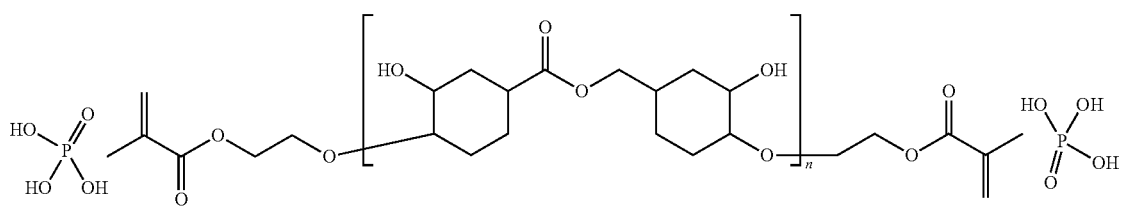

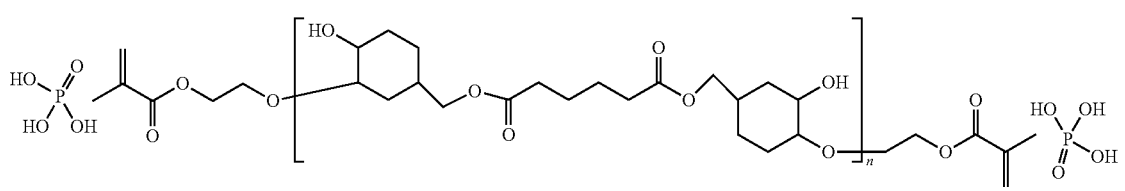

wherein, n is an integer selected from 1~21 in formula II and III.

Another embodiment according to the present invention provides a photoresist composition, comprising:

30~50 parts by weight of one or more of the above-described epoxy acrylate modified with phosphate monomers;

10~20 parts by weight of aliphatic polyurethane acrylate resins;

20~30 parts by weight of active monomers;

5~10 parts by weight of active diluent agents;

2~5 parts by weight of photoinitiators;

30~35 parts by weight of organic solvents.

Since the epoxy acrylate modified with phosphate monomers is employed in the photoresist composition, thus the formed transparent photoresist has a good adhesion property towards the base material. Since the aliphatic polyurethane acrylate resin is employed, thus the formed transparent photoresist is good in light resistance, weather resistance (including higher temperature resistance, yellowing resistance and ultraviolet light resistance) as well as the flexibility. When the amount of epoxy acrylate modified with phosphate monomer is relatively small, the formed film will be poor in compactness, when the amount of epoxy acrylate modified with phosphate monomer is relatively large, the formed film will be poor in adhesion force. When the amounts of aliphatic polyurethane acrylate resin is relatively small, the formed film will be poor in light resistance, weather resistance, and the yellowing will occur easily; when the amount of aliphatic polyurethane acrylate resin is relatively large, the formed film will be poor in solvent resistance and contamination resistance. When the amounts of active monomer is relatively small, the formed film will be poor in light resistance, weather resistance, and the yellowing will occur easily; when the amount of active monomer is relatively large, the formed film after curing will be poor in surface smoothness. When the amounts of active diluent agent is relatively small, the viscosity can not be decreased efficiently; when the amount of active diluent agent is relatively large, the reactivity will be affected, thus the curing speed tends to be too fast with uncompleted curing. When the amount of photoinitiator is relatively small, the unsaturated groups can not polymerize completely, and the cured film tends to have a rough surface, when the amount of photoinitiator is relatively large, some photoinitiator will be wasted to therefore increasing the cost. The organic solvent is used for adjusting the viscosity of the photoresist composition, when the amount of the organic solvent is relatively small, the viscosity of the photoresist composition will be relatively high, resulting in uneven coating; when the amount of the organic solvent is too large, the viscosity of the photoresist composition is relatively low, and it requires multiple coating films to achieve a film layer with a certain thickness, thus the steps of the processes is increased, thereby increasing the cost.

The inventors further found that, preferably, when the amount of the epoxy acrylate modified with phosphate monomer is in the range of 40~48 parts by weight, the aliphatic polyurethane acrylate resin is in the range of 12~15 parts by weight, the active monomer is in the range of 20~25 parts by weight, the active diluent agent is in the range of 5~8 parts by weight, the photoinitiator is in the range of 3~4 parts by weight, and the organic solvent is in the range of 32~34 parts by weight, the transparent photoresist formed the obtained photoresist composition has a good property, hence, the yellowing phenomenon can be avoided while the transmittance is significantly improved.

Preferably, the active monomer includes low functionality monomers, alkyl chain-acrylates, and high functionality monomers in a range of 1:0.5~1:1.5~6 by mass ratio. Low functionality monomers (including 1~3 functional groups) can form a highly smooth film which is resist to solvents and contamination; alkyl chain-acrylates can form a film which has good resistance to photo decomposion, high temperature, and acidic or alkaline corrosion; high functionality monomer (including more than 3 functional groups) has a high ultraviolet activity, high crosslinking density, and the cured film formed therefrom is very rigid, but brittle at the same time. Therefore, when the three of the above is used in combination, especially with a ratio of 1:0.5~1:1.5~6, the resultant cured film can have a high hardness and toughness, while having the characteristics of anti-pollution, high temperature resistance and anti-corrosion and the like.

Preferably, the low functionality monomer includes but is not limited to cyclohexane-1,4-dimethanol divinylether or triglycol divinyl ether; the alkyl chain-acrylates include glycol dimethacrylate or triethylene glycol di-2-methyl acrylate; the high functionality monomer includes ethoxylated pentaerythritol tetracrylate, dipentaerythritol pentaacrylate, pentaacrylate, or dipentaerythritol hexaacrylate Preferably, the active diluent agent includes one or more of allyl glycidyl ether, glycidyl phenyl ether, glycol diglycidyl ether and ricinus oil triglycidyl ether; the photoinitiator includes cyanine dye cation complexes, triphenyl-alkyl boron anion complexes and aromatic iodonium salts; the organic solvent includes aliphatic organic solvents. As for the photoinitiator, mixed initiation system is adopted. A mixed initiator formed by mixing the initiators that initiates radical polymerization and cation ring-open polymerization can be used, since the active monomers are formed by mixing several kinds of monomers.

Preferably, the photoresist composition further includes 3~5 parts by weight of fillers and 1~2 parts by weight of additives.

Preferably, the filler includes polyamide wax suspensions, silica and mica; the additive includes anti-foaming agents, dispersing agents or leveling agents. Polyamide wax suspensions are formed by mixing and stirring 60% by mass of 1,6-hexanediol diacrylate and 40% by mass of polyamide wax suspension. The anti-foaming agents may be, for example, silicones, hydrocarbons or acryls anti-foaming agents. The leveling agents may be, for example, BYK acrylates polymers. The addition of fillers and additives facilitates the film formation property.

An embodiment of the present invention provides a transparent photoresist obtained from the photoresist composition of the present invention.

Another embodiment of the present invention provides a printed circuit board, the solder resist of which is obtained from any of the above photoresist composition.

Yet another embodiment of the present invention provides a transparent electrode protective film obtained from any of the above photoresist composition.

An embodiment of the present invention further provides a method for producing the above-described modified epoxy acrylate, comprising:

Performing a polymerization of 2-hydroxyethyl methacrylate phosphate and epoxy compound represented by formula IV in the present of a basic catalyst, to obtain epoxy acrylate modified with phosphate monomers represented by formula I, wherein, the molar ratio of the 2-hydroxyethyl methacrylate phosphate to the epoxy compound is 1:0.5~10; the reaction formula being as follows:

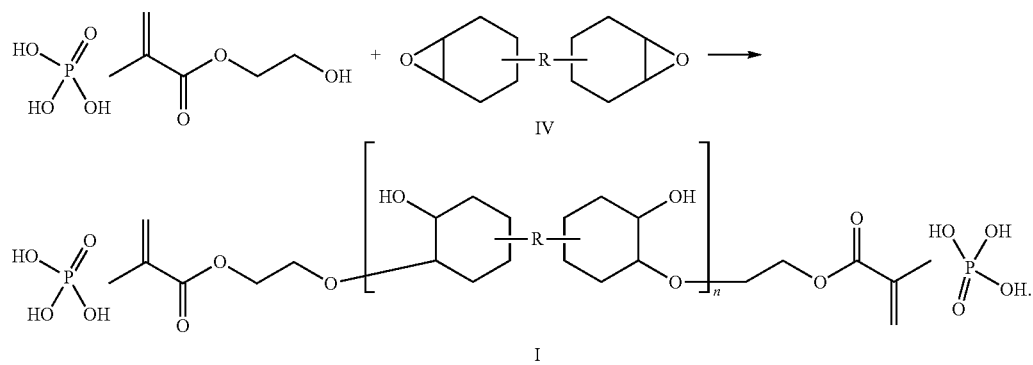

Particularly, the production method may include: adding the epoxy carboxylic ester compound IV and a mixed solvents of proprylene glycol monomethyl ether and n-butanol into flask, increasing the temperature to about 100~120° C.; after the dissolution of epoxy resin, the phosphate (such as 2-hydroxyethyl methacrylate phosphate) being added dropwise and subsequently the basic catalyst being added;, increasing the temperature to 130-150° C. after the addition is completed and keep reacting for 3~5 hours, cooling to obtain epoxy acrylate modified with functional phosphate monomers.

An embodiment of the present invention further provides a method for producing a photoresist composition, comprising:

Taking and mixing the epoxy acrylate modified with phosphate monomers, aliphatic polyurethane acrylate resins, active monomers, active diluent agents and the photoinitiators according to the respective parts by weight, to obtain a mixture;

Performing a sand grinding treatment of the above mixture, to form a mixture with a micron level fineness; and Adjusting the viscosity of the mixture with a micron level fineness with organic solvents.

EXAMPLES

The following examples specifically describe the epoxy acrylate modified with phosphate monomers of the present invention and the method for producing the same, the photoresist composition and the method for producing the same. However, the present invention is not limited to the following examples. It should be noted that, unless specified otherwise, the respective constituents in the photoresist composition is represented in "parts by weight".

Example 1

Preparation of 3,4-epoxycyclohexylmethyl3',4'-epoxycyclohexyl Formate Modified with 2-hydroxyethyl methacrylate phosphate (Preparation of Formula II):

100 g of the epoxy compound (i.e. 3,4-epoxycyclohexylmethyl 3',4'-epoxycyclohexyl formate, 0.294 mol) and 500 ml of the mixed solvents of proprylene glycol monomethyl ether and n-butanol are added into a 1000 ml flask and heated to 100° C.; after the dissolution of the epoxy compound, 125.3 g of 2-hydroxyethyl methacrylate phosphate (which is dissolved in 100 ml proprylene glycol monomethyl ether) is added dropwise, and then 1 g of hydroquinone as polymerization inhibitor and 10 g of tertiary amine catalyst are added therein. The reactant mixture is heated to 130° C. and kept for 3 hours. The obtained product is cooled and the solvent is removed by filtration to obtain the epoxy acrylate modified with 2-hydroxyethyl methacrylate phosphate. The product is identified by nuclear magnetic resonance (NMR): before the reaction, the chemical shift of the hydrogen atoms linked to the two carbons of the epoxy group of the epoxy compound is (δ: 3.05, 2.68, 2.35); while after the reaction, the hydrogen atoms of the corresponding two carbon atoms has a chemical shift of (δ: 4.03, 3.65, 3.37) since the epoxy group is disappeared from the epoxy compound after reaction.

The synthesis route of the above reaction is:

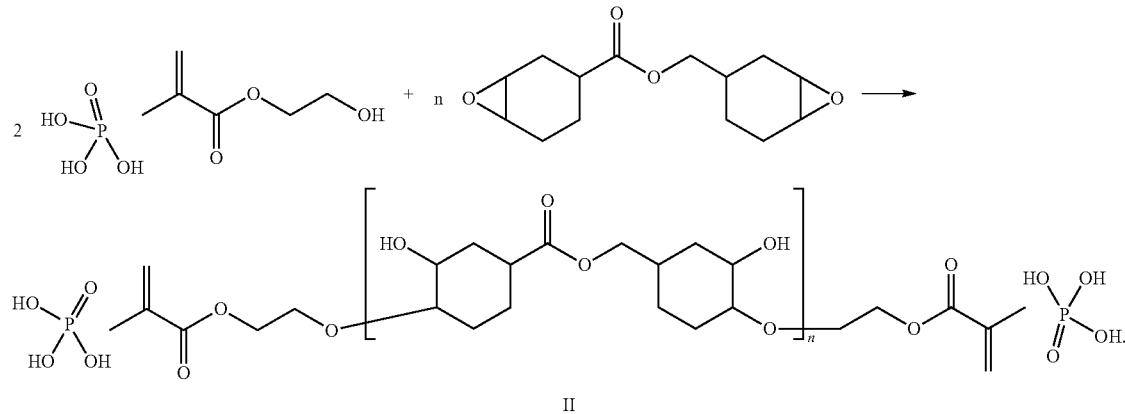

The product has a weight-average molecular weight in a range of 1500-3900 (measured by Gel permeation chromatography (GPC) with THF as the eluent).

Example 2

Preparation of bis[(3,4-epoxycyclohexyl)methyl]adipate Modified with 2-hydroxyethyl methacrylate phosphate (Preparation of Formula III):

100 g of the epoxy compound (hence, bis[(3,4-epoxycyclohexyl)methyl]adipate (0.231 mol)), and 500 ml of the mixed solvents of propylene glycol monomethyl ether and n-butanol are added into a 500 ml flask, increasing the temperature to 120° C.; after the dissolution of the epoxy compound, 148 g 2-hydroxyethyl methacrylate phosphate (which is dissolved in 100 ml proprylene glycol monomethyl ether) is added dropwise, and then 1.5 g benzenediol inhibitor and 15 g tertiary amine-type catalyst is added; the reactant mixture is heated to 140° C. and kept for 5 hours, and the resultant is cooled and filtered to give bis[(3,4-epoxycyclohexyl)methyl]adipate modified with 2-hydroxyethyl methacrylate phosphate (Formula III). The reaction product is identified by nuclear magnetic resonance (NMR): the chemical shift of the hydrogen atoms linked to the two carbons of the epoxy group of the epoxy compound before the reaction is (δ: 3.05, 2.81, 4.75), while the corresponding hydrogen atoms of the two carbon atoms has a chemical shift of (δ: 4.06, 3.83, 5.87), since the epoxy group is disappeared from the epoxy compound after reaction.

The synthesis route of the above reaction is:

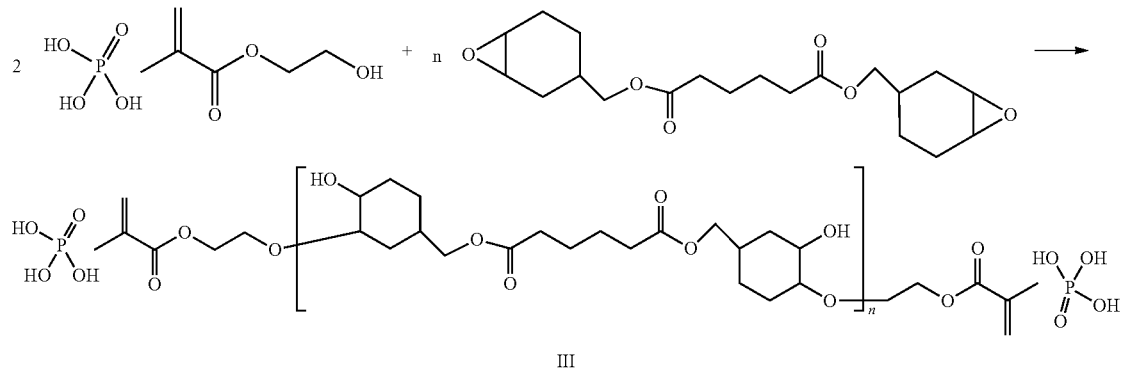

III

The product has a weight-average molecular weight in a range of 1800-4900 (measured by Gel permeation chromatography (GPC) with THF as the eluent).

Preparation of the Photoresist Composition and the Transparent Photoresist (i.e. the Cured Film)

Photoresist composition 1~4 are prepared by employing the epoxy acrylates modified with phosphate monomers obtained from Example 1 and Example 2 as well as other constituents of the photoresist composition.

Unless noted otherwise, the fineness of the composition was measured according to the following method: the composition to be measured is diluted for 10 folds firstly, and then the diluted composition was measured by a Malvern particle size analyzer (NaNo ZS, manufactured by Malvern Co. Ltd).

Unless noted otherwise, the viscosity of the composition is measured by DV-C digital viscometer (manufactured by Brookfield Co. Ltd, USA).

Example 3

Preparation of Photoresist Composition 1

30 parts of the epoxy acrylate modified with phosphate monomer represented by Formula II, 20 parts of the polyurethane acrylate (7200, Jiangmen Hengguang New Materials Co., Ltd), 4 parts of 1,4-cyclohexanedimethanol divinyl ether (Shanghai Polydex Industry Co., Ltd), 4 parts of Ethyleneglycol dimetharcylate (Shanghai Chunall International Trade Co., Ltd) and 12 parts of Dipentaerythritol pentaacrylate (Shanghai Richness Chemical Co., Ltd), 5 parts of ricinus oil triglycidyl ether as the diluent agent (Shenzhen Jiada Chemical Engineering Co., Ltd), 3 parts of fillers (polyamine wax, Kunshan superfine materials of tangible elements Co., Ltd; silica, Shouguang Baote Chemical Co., Ltd; and mica, Shenzhen Haiyang Powder Technology Co., Ltd), 3 parts of cyanine dye cation complexes photoinitiator, 0.5 parts of anti-foaming agents (BYK-075, BYK Additives & Instruments, Germany), 0.6 parts of leveling agents (BYK-354, BYK Additives & Instruments, Germany), 32 parts of propylene glycol diacetate (Shanghai Yanshou Chemical Engineering Co., Ltd) as the organic solvent are homogenously mixed by the Ultrasonic process (frequency 25 KHz, time 30 min), followed by sand milling with a sand miller. The resultant mixture has a fineness of 7 μm, and then 2 parts of methyl methacrylate (Jinan Yuanyang Chemical Engineering Co., Ltd) is added to adjust the viscosity to 150 cps measured at 25° C., so as to obtain the photoresist composition 1.

Example 4

Preparation of Photoresist Composition 2

48 parts of the epoxy acrylate modified with phosphate monomer represented by Formula III, 12 parts of the polyurethane acrylate, 6 parts of triglycol divinyl ether (GuangZhou Sunlake Trading Co., Ltd), 3 parts of Ethyleneglycol dimetharcylate and 9 parts of Dipentaerythritol pentaacrylate, 4 parts of glycol diglycidyl ether as the diluent agent (Changzhou Hongyu Chemical Co., Ltd), 4 parts of fillers (polyamine wax; silica; and mica), 3.5 parts of aromatic iodonium salt photoinitiator (Shanghai Fanke Co., Ltd), 0.6 parts of anti-foaming agents (BYK-355, BYK Additives & Instruments, Germany), 0.5 parts of leveling agents (BYK-380, BYK Additives & Instruments, Germany), 33 parts of 2-Methyl-3-heptanone (Haorui Chemistry (Shanghai) Co., Ltd) as the organic solvent are homogenously mixed by the Ultrasonic process (frequency 25 KHz, time 35 min), followed by sand milling with a sand miller. The resultant mixture has a fineness of 5 μm, and then 2 parts of allyl glycidyl ether (Jinan TianQiao XianKe Chemical product department) is added to adjust the viscosity to 200 cps measured at 25° C., so as to obtain the photoresist composition 2.

Example 5

Preparation of Photoresist Composition 3

50 parts of the epoxy acrylate modified with phosphate monomer represented by Formula II, 10 parts of the polyurethane acrylate, 6 parts of 1,4-cyclohexanedimethanol divinyl ether, 6 parts of Ethyleneglycol dimetharcylate and 18 parts of ethoxylated pentaerythritol tetracrylate (Shanghai Chunall International Trade Co., Ltd), 3 parts of glycol diglycidyl ether as the diluent agent, 4 parts of triphenyl-alkyl boron anion complexes photoinitiator, 0.8 parts of anti-foaming agents (BYK-355, BYK Additives & Instruments, Germany), 0.7 parts of leveling agents (BYK-358, BYK Additives & Instruments, Germany), 30 parts of cyclohexanone (Jinan Lianying Chemical Co., Ltd) as the organic solvent are homogenously mixed by the Ultrasonic process (frequency 25 KHz, time 35 min), followed by sand milling with a sand miller. The resultant mixture has a fineness of 6 pm, and then 2 parts of allyl glycidyl ether is added to adjust the viscosity to 180 cps measured at 25° C., so as to obtain the photoresist composition 3.

Example 6

Preparation of Photoresist Composition 4

40 parts of the epoxy acrylate modified with phosphate monomer represented by Formula III, 15 parts of the polyurethane acrylate, 4.3 parts of 1,4-cyclohexanedimethanol divinyl ether, 3.4 parts of ethyleneglycol dimetharcylate and 17.3 parts of dipentaerythritol hexaacrylate (Shanghai Richness Chemical Co., Ltd), 6 parts of allyl glycidyl ether as the diluent agent, 2.5 parts of cyanine dye cation complexes, 1.5 parts of triphenyl-alkyl boron anion complexes photoinitiator, 0.6 parts of anti-foaming agents (BYK-325, BYK Additives & Instruments, Germany), 0.8 parts of leveling agents (BYK-390 BYK Additives & Instruments, Germany), 35 parts of ethyl 3-ethoxypropionate (Dow Chemical, America) as the organic solvent are homogenously mixed by the Ultrasonic process (frequency 25 KHz, time 40 min), followed by sand milling with a sand miller. The resultant mixture has a fineness of 8 μm, and then 2 parts of glycol diglycidyl ether is added to adjust the viscosity to 130 cps measured at 25° C., so as to obtain the photoresist composition 4.

Comparative Example 1

Preparation of photoresist composition 5

10 parts of phenolic epoxy acrylate 5327 (Tianjin Haiyinci Co., Ltd.), 4 parts of 1,4-cyclohexanedimethanol divinyl ether, 12 parts of Dipentaerythritol pentaacrylate and 5 parts of ricinus oil triglycidyl ether as the diluent agent, 3 parts of fillers (polyamine wax, silica and mica), 3.5 parts of aromatic iodonium salt photoinitiator, 0.5 parts of anti-foaming agents, 0.5 parts of leveling agents, 35 parts of Propylene glycol diacetate as the organic solvent are homogenously mixed by the Ultrasonic process (frequency 25 KHz, time 30 min), followed by sand milling with a sand miller. The resultant mixture has a fineness of 7 μm, and then 2 parts of methyl methacrylate is added to adjust the viscosity to 150 cps measured at 25° C., so as to obtain the photoresist composition 5.

Comparative Example 2

Preparation of Photoresist Composition 6

60 parts of epoxy methyl acrylate, 3 parts of triethylene glycol di-2-methyl acrylate, 9 parts of dipentaerythritol hexaacrylate and 4 parts of allyl glycidyl ether as the diluent agent, 3 parts of fillers (polyamine wax, silica and mica), 4 parts of cyanine dye cation complexes photoinitiator, 0.6 parts of anti-foaming agents, 0.5 parts of leveling agents, 35 parts of ethyl 3-ethoxypropionate as the organic solvent are homogenously mixed by the Ultrasonic process (frequency 25 KHz, time 30 min), followed by sand milling with a sand miller. The resultant mixture has a fineness of 5 μm, and then 2 parts of methyl methacrylate is added to adjust the viscosity to 200 cps measured at 25° C., so as to obtain the photoresist composition 6.

Transparent photoresist 1~6 are obtained from photoresist composition 1~6 by the following method: applying the above photoresist composition 1~6 by spin coating to a pre-determined thickness on the flexible wiring board or the transparent electrode on which a circuit has been formed by etching the copper foil. Pre-baking for about 10 min at 80° C., and irradiating to perform exposure with the ultraviolet light of 345 nm (10 mJ/cm$^2$), the exposed portion is removed with diluted alkaline water (KOH diluted solution), to thereby obtain the solder resist or transparent protective film (hence, transparent photoresist 1~6) with the image as required. The film has a thickness of about 20 μm.

Evaluation of the Properties of the Film

Yellowing Resistance: applying the above photoresist compositions 1~6 onto the surface of a flexible wiring board respectively, and then performing light irradiation for 200h and observing the degree of color changing.

Adhesion Force Test: 100 small grids of 1 mm×1 mm are formed on the surface of the transparent photoresists 1~6 using a sharp blade, wherein the cutting edge is 15-30 degrees and every scratch line should reach as deep as the film. The region to be tested is cleaned with a brush, and the grids to be tested are adhered intimately with a tape (3M 610) having an adhesion force of 0.47N/mm for 3 minutes. Then both ends of the tape are hold and pulled instantaneously off the tape in a direction perpendicular to the surface of the tape. Such process including adhesion and pulling off is repeated once more. The transparent photoresist on which the ratio of the falling off area/entire area <5% is evaluated as "Qualified".

Folding Resistance: the transparent photoresists 1~6 are repeatedly folded for 180 degrees, and the number of repeat is recorded when the transparent photoresist is broken by observing with naked eyes and an optical metallographic microscope (400×, Nikon Eclipse ME600, Hitachi Co., Ltd).

Total Light Transmittance: the transparent photoresists 1~6 are prepared on the surface of transparent electrodes respectively, and then measure the total light transmittance in the range of visible spectrum using a colorimeter (LCF-100M, OTSUKA Electronics Co., Ltd).

Insulation Resistance: the photoresist compositions 1~6 are applied onto flexible wiring boards to obtain solder resist films (i.e, transparent photoresists 1~6) by exposure and developing. The insulation resistances thereof are measured under Direct Current (DC) of 50V by M12123 Insulation Resistance Analyzer (Chengdu Fuke Instruments Co. Ltd) after being humidified at 40° C. and 90% R.H. for 168 h.

Resolution: the photoresist compositions 1~6 are applied onto silica glasses respectively. The photoresist compositions are pre-baked and exposed in the present of photomask plate (line width of 3~80 μm), and then they are developed to obtain line-type transparent photoresists 1~6. The width of the residual lines and the falling of lines are measured by an optical metallographic microscope (400×, Nikon Eclipse ME600, Hitachi Co., Ltd).

Oil Resistance: after wetting the surfaces of the transparent photoresist 1~6 with 98% industrial alcohol (ethanol) for 10 min, the surfaces are manually wiped with a force of 500 g/cm$^2$ for 500 times. The transparent photoresist with no falling off and no base material exposure is evaluated as "qualified".

Acid and Alkaline Resistance test: 19.9 g of NaCl, 17.5 g of ammonia chloride, 5 g of CO(NH2)2, and 2.5 g acetic acid and 15 g of lactic acid (C3H6O3) are dissolved into fresh distilled water and stirred until complete dissolution, and then NaOH is added to adjust the pH value to 4.2 or 8.8, so as to prepare synthetic perspiration. A piece of gauze is sufficiently impregnated with the synthetic perspiration and then is wrapped on the surfaces of the transparent photoresists 1~6 respectively with ensuring the sufficient contact between the surface of gauze and the surface of the transparent photoresists 1~6 followed by being kept in the testing environment (2° C.) for 24 hours. The transparent photoresist with no obvious change (for example, no falling-off or foaming) on the tested surface is evaluated as qualified.

Environmental Resistance Test: the transparent photoresists 1~6 undergo high temperature of 60° C. and a low temperature of −40° C. for 12 hours respectively. The transparent photoresist with no obvious appearance change (for example, no falling-off or cracking) is evaluated as "qualified".

The test results of the photoresist compositions 1~6 is shown in table 1.

It can be seen from the results as shown in table 1, the photo-curing transparent resin according to the present invention is excellent in yellowing resistance, adhesion property and light transmittance. The yellowing resistance is excellent since the aliphatic polyurethane acrylate is used. The epoxy acrylate modified with phosphate monomer is used so that the phosphate can react with the multi-valence metal in substrates, thereby connecting the polymer onto the substrates firmly through covalent bond; therefore the adhesion force is excellent. The folding resistance, oil resistance and the acid and alkaline resistance as well as the environmental resistance (both the high temperature and the low temperature) of the cured film is improved as a result of the use of the low functionality monomer and the high functionality monomer in combination. Therefore, the transparent photoresist formed from the photoresist composition of the present invention has the above excellent properties, to enable the use for the solder resist or the transparent electrode protective film.

It is understood that the present invention is not limited to the above-illustrated embodiments, which were chosen and described in order to best explain the principles of the invention. Those skilled in the art can make various modifications or variations without departing from the spirit and essence of the present invention. It is intended that the scope of the invention be defined by the following claims and their equivalents.

The invention claimed is:
1. A modified epoxy acrylate, which is epoxy acrylate modified with phosphate monomers, having the structural formula represented by Formula I

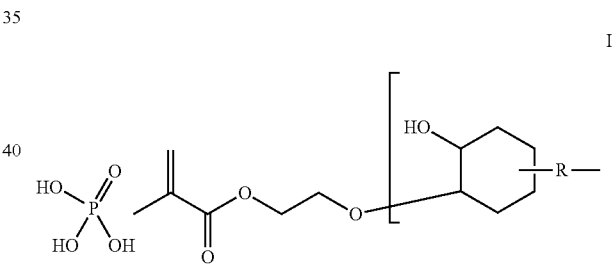

TABLE 1

| Test result | Yellowing resistance | Adhesion force | Folding resistance | Total light transmittance | insulation resistance | resolution | oil resistance | Acid and alkaline resistance | Environmental resistance |
|---|---|---|---|---|---|---|---|---|---|
| Example1 | No yellowing | 99/100 | Crack after 10 cycles | 96% | $2.8 \times 10^{12}$ Ω | 10 μm | qualified | qualified | qualified |
| Example2 | No yellowing | 98/100 | crack after 12 cycles | 97% | $2.7 \times 10^{12}$ Ω | 10 μm | qualified | qualified | qualified |
| Example3 | No yellowing | 98/100 | crack after 15 cycles | 98% | $3.0 \times 10^{12}$ Ω | 7 μm | qualified | qualified | qualified |
| Example4 | No yellowing | 97/100 | crack after 14 cycles | 97% | $3.1 \times 10^{12}$ Ω | 7 μm | qualified | qualified | qualified |
| Com. Example1 | Yellowing | 90/100 | crack after 7 cycles | 93% | $2.1 \times 10^{12}$ Ω | 20 μm | not qualified | qualified | not qualified |
| Com. Example2 | Yellowing | 88/100 | crack after 5 cycles | 92% | $2.2 \times 10^{12}$ Ω | 25 μm | qualified | not qualified | qualified |

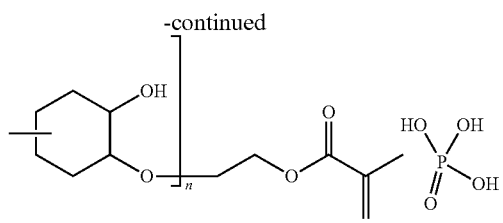

wherein, n is an integer selected from 1~21, R is a short-chain carboxylic acid ester group having the structural formula

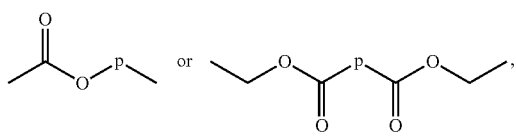

in which p is a bivalent saturated or unsaturated carbon chain having 1~10 carbon atoms, and the carbon chain is optionally substituted by alkyl, alkenyl, hydroxy, nitro or halogen.

2. The modified epoxy acrylate according to claim 1, wherein, said epoxy acrylate modified with phosphate monomers has the structural formulas represented by Formula II or Formula III

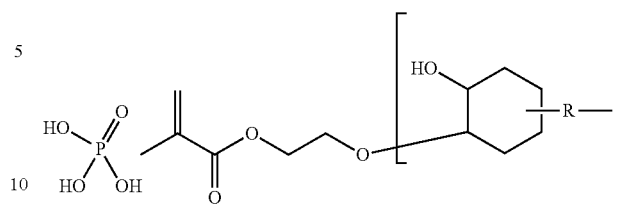

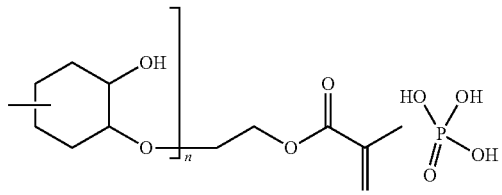

wherein, n is an integer selected from 1~21, R is a short-chain carboxylic acid ester group having the structural formula

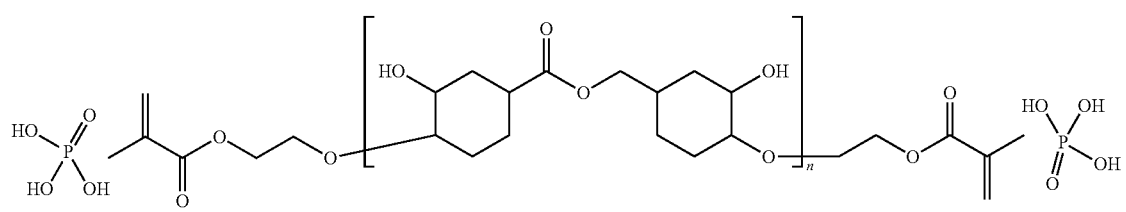

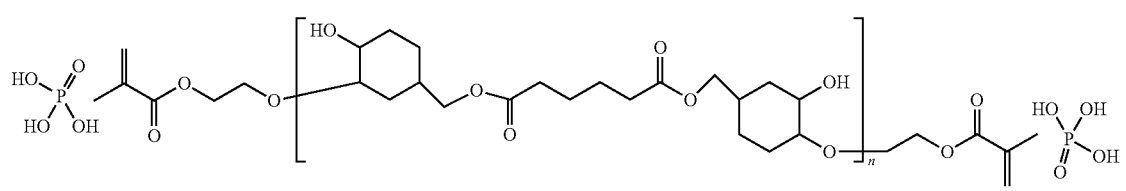

wherein, n is an integer selected from 1~21.

3. A photoresist composition, comprising:

30~50 parts by weight of the epoxy acrylate modified with phosphate monomers represented by Formula I;

10~20 parts by weight of aliphatic polyurethane acrylate resin;

20~30 parts by weight of active monomers;

5~10 parts by weight of active diluent agents;

2~5 parts by weight of photoinitiators;

30~35 parts by weight of organic solvents,

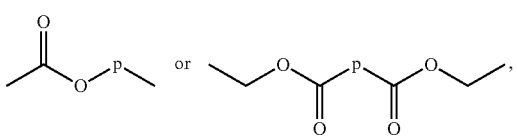

in which p is a bivalent saturated or unsaturated carbon chain having 1~10 carbon atoms, and the carbon chain is optionally substituted by alkyl, alkenyl, hydroxy, nitro or halogen;

wherein said active monomers consist of low functionality monomer, alkyl chain-acrylates, and high functionality monomer; said low functionality monomer is cyclohexane-1,4-dimethanol divinylether or triglycol divinyl ether; the high functionality monomer is ethoxylated pentaerythritol tetraacrylate, dipentaerythritol pentaacrylate, or dipentaerythritol hexaacrylate; and wherein the active diluent agent consists of one or more of allyl glycidyl ether, glycidyl phenyl ether, glycol diglycidyl ether and ricinus oil tryglycidyl ether.

4. The photoresist composition according to claim 3, wherein, said epoxy acrylate modified with phosphate monomer is in the range of 40~48 parts by weight; the aliphatic polyurethane acrylate resin is in the range of 12~15 parts by weight; the active monomer is in the range of 20~25 parts by weight; the active diluent agent is in the range of 5~8 parts by weight; the photoinitiator is in the range of 3~4 parts by weight; the organic solvent is in the range of 32~34 parts by weight.

5. The photoresist composition according to claim 3, wherein, said active monomer consist of low functionality monomer, alkyl chain-acrylates, and high functionality monomer in a range of 1:0.5~1:1.5~6 by mass ratio.

6. The photoresist composition according to claim 5, wherein the alkyl chain-acrylates include Glycol dimethacrylate or Triethylene glycol di-2-methyl acrylate.

7. The photoresist composition according to claim 3, wherein the photoinitiator includes cyanine dye cation complexes, triphenyl-alkyl boron anion complexes and aromatic iodonium salts; and the organic solvent includes aliphatic organic solvents.

8. The photoresist composition according to claim 3, wherein said photoresist composition further includes 3~5 parts by weight of fillers, and 1~2 parts by weight of additives selected from the group consisting of anti-foaming agents, dispersing agents, leveling agents, and mixtures thereof.

9. The photoresist composition according to claim 8, wherein, said filler includes polyamide wax suspensions.

10. A transparent photoresist obtained from a photoresist composition according to claim 3.

11. A method for producing a modified epoxy acrylate represented by Formula I, comprising:

Performing a polymerization of 2-hydroxyethyl methacrylate phosphate and epoxy compound represented by formula IV in the presence of a basic catalyst, to obtain the epoxy acrylate modified with phosphate monomers represented by formula I, wherein, the molar ratio of the 2-hydroxyethyl methacrylate phosphate to the epoxy compound is 1:0.5~10; the reaction formula being as follows:

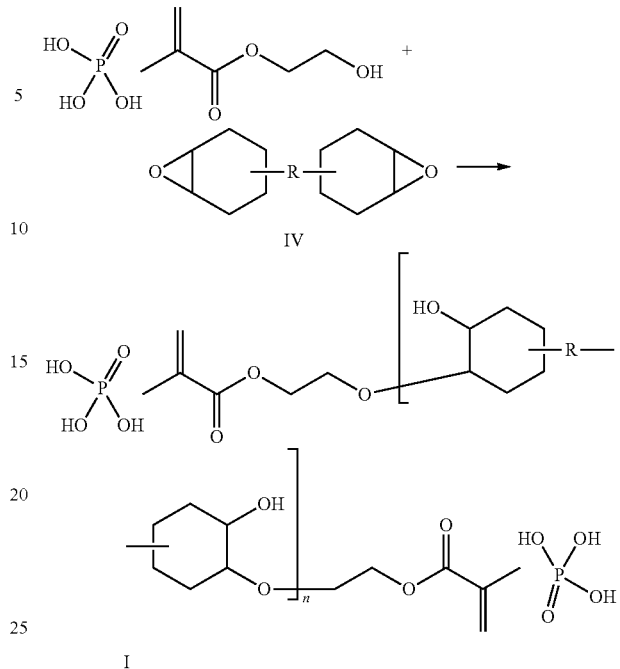

wherein, n is an integer selected from 1~21, R is a short-chain carboxylic acid ester group having the structural formula

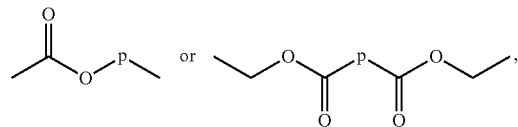

in which p is a bivalent saturated or unsaturated carbon chain having 1~10 carbon atoms, and the carbon chain is optionally substituted by alkyl, alkenyl, hydroxy, nitro or halogen.

12. A method for producing a photoresist composition according to claim 3, wherein
the method comprises:
taking and mixing the epoxy acrylate modified with phosphate monomers, aliphatic polyurethane acrylate resins, active monomers, active diluent agents and photoinitiators according to the respective parts by weight, to obtain a mixture;
performing a sand grinding treatment of the above mixture, to form a mixture with a micron level fineness;
adjusting the viscosity of the mixture with a micron level fineness with organic solvents.

* * * * *